(12) United States Patent
Lee et al.

(10) Patent No.: US 10,199,438 B2
(45) Date of Patent: Feb. 5, 2019

(54) TOP-EMITTING ORGANIC ELECTROLUMINESCENT DISPLAY PANEL, MANUFACTURING METHOD THEREOF AND DISPLAY DEVICE

(71) Applicant: Boe Technology Group Co., Ltd., Beijing (CN)

(72) Inventors: Joohyeon Lee, Beijing (CN); Lujiang Huangfu, Beijing (CN); Jinsan Park, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 14/906,504

(22) PCT Filed: Sep. 8, 2015

(86) PCT No.: PCT/CN2015/089150
§ 371 (c)(1),
(2) Date: Jan. 20, 2016

(87) PCT Pub. No.: WO2016/141698
PCT Pub. Date: Sep. 15, 2016

(65) Prior Publication Data
US 2017/0110518 A1    Apr. 20, 2017

(30) Foreign Application Priority Data
Mar. 10, 2015  (CN) .......................... 2015 1 0104824

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 51/5253* (2013.01); *H01L 51/5284* (2013.01); *H01L 51/56* (2013.01)

(58) Field of Classification Search
None
See application file for complete search history.

(56) References Cited

U.S. PATENT DOCUMENTS 6,552,488 B1   4/2003  Roitman et al.
9,035,286 B2 *  5/2015  Chen ..................... H01L 27/322
                                                         257/40

(Continued)

FOREIGN PATENT DOCUMENTS

CN        1815750      8/2006
CN      101447509      6/2009

(Continued)

OTHER PUBLICATIONS

Office Action from China Application No. 201510104824.8 dated Oct. 26, 2016.

(Continued)

*Primary Examiner* — Lex Malsawma
(74) *Attorney, Agent, or Firm* — Calfee, Halter & Griswold LLP

(57) ABSTRACT

A top-emitting organic electroluminescent display panel, a manufacturing method, and a display device. The top-emitting organic electroluminescent display panel comprises: a substrate, a layer of white organic light emitting diodes and a thin film encapsulation layer arranged on the substrate in sequence. The thin film encapsulation layer comprises at least two inorganic thin film layers and at least one organic thin film layer. At least one organic thin film layer is a color filter layer, the color filter layer being arranged between the at least two inorganic thin film layers. Since one of the organic thin film layers in the thin film (Continued)

encapsulation layer is a color filter layer, the color filter layer does not have to be arranged above the thin film encapsulation layer separately, thus reducing the number of film layers, simplifying the film layer structure, reducing manufacturing costs, and improving the luminous efficiency and the display effect.

9 Claims, 5 Drawing Sheets

(56) References Cited

U.S. PATENT DOCUMENTS

| | | | | |
|---|---|---|---|---|
| 9,318,726 | B2* | 4/2016 | Choi | H01L 51/5275 |
| 2006/0232195 | A1 | 10/2006 | Cok et al. | |
| 2006/0290276 | A1 | 12/2006 | Cok et al. | |
| 2007/0115422 | A1* | 5/2007 | Lee | G02F 1/133377 |
| | | | | 349/156 |
| 2008/0081105 | A1 | 4/2008 | Suh et al. | |
| 2010/0232162 | A1* | 9/2010 | Shin | H01L 27/322 |
| | | | | 362/293 |
| 2010/0237362 | A1* | 9/2010 | Okabe | G02F 1/133345 |
| | | | | 257/88 |
| 2011/0250713 | A1* | 10/2011 | Kawasaki | H01L 29/458 |
| | | | | 438/34 |
| 2012/0038267 | A1* | 2/2012 | Hanamura | H01L 27/322 |
| | | | | 313/504 |
| 2012/0218173 | A1* | 8/2012 | Ohta | G02B 3/0056 |
| | | | | 345/76 |
| 2014/0027724 | A1* | 1/2014 | Lim | H01L 51/5281 |
| | | | | 257/40 |
| 2014/0062292 | A1* | 3/2014 | Seong | H01L 51/5253 |
| | | | | 313/504 |
| 2014/0117334 | A1* | 5/2014 | Nakamura | H01L 27/322 |
| | | | | 257/40 |
| 2015/0349030 | A1* | 12/2015 | Ono | H01L 51/5284 |
| | | | | 257/40 |
| 2016/0064694 | A1* | 3/2016 | Choi | H01L 51/5275 |
| | | | | 257/40 |
| 2016/0218325 | A1* | 7/2016 | Choi | H01L 51/5275 |

FOREIGN PATENT DOCUMENTS

| | | |
|---|---|---|
| CN | 103700687 | 4/2014 |
| CN | 104701465 | 6/2015 |

OTHER PUBLICATIONS

Office Action from China Application No. 201510104824.8 dated Feb. 15, 2017.
International Search Report and Written Opinion from PCT/CN15/89150 dated Nov. 12, 2015.
Office action from Chinese Application No. 201510104824.8 dated Jun. 27, 2016.

* cited by examiner

TOP-EMITTING ORGANIC ELECTROLUMINESCENT DISPLAY PANEL, MANUFACTURING METHOD THEREOF AND DISPLAY DEVICE

RELATED APPLICATIONS

The present application is the U.S. national phase entry of PCT/CN/2015/089150, with an international filing date of Sep. 8, 2015, which claims the benefit of Chinese Patent Application No. 201510104824.8, filed on Mar. 10, 2015, the entire disclosures of which are incorporated herein by reference.

FIELD OF THE INVENTION

The present invention relates to the field of display technology, particularly to a top-emitting organic electroluminescent display panel, a manufacturing method thereof and a display device.

BACKGROUND OF THE INVENTION

At present, the organic electroluminescent display and organic light emitting diode (OLED) have gradually become the mainstream of the display field due to their excellent performance of low power consumption, high color saturation, wide visual angle, small thickness, and flexibility. The OLED can be classified into bottom-emitting type and top-emitting type according to the light emission manner. The light emission in the bottom-emitting OLED comes from the side of the substrate, while the light emission in the top-emitting OLED comes from the top.

In order to realize full color of the large-size OLED panel, top-emitting white organic light emitting diodes and a color filter layer are generally superimposed. In the prior art, when the top-emitting OLED panel is manufactured, as shown in FIG. 1, a layer of white organic light emitting diodes 02 is formed on a substrate 01 firstly, then a thin film encapsulation layer 03 is formed with the thin film encapsulation technology. The thin film encapsulation layer 03 is a multi-layer film structure of at least three layers constituted by mutual alternation of an inorganic thin film layer 031 and an organic thin film layer 032, for blocking permeation of external moisture and oxygen. The inorganic thin film layer 031 has a relatively high compactness and is the main water and oxygen barrier layer; however, the inorganic thin film layer 031 has a relatively low elasticity, and a large inner stress, which is easily affected by the external force so as to generate cracks or to be stripped from the OLED device. Hence, it should cooperate with the organic thin film layer 032, which is formed by using the methods such as monomer deposition or polymer coating as a buffer layer. The organic thin film layer 032 has a relatively high elasticity, which can effectively prevent the inorganic thin film layer 031 from cracking. After the thin film encapsulation layer 03 is formed with the thin film encapsulation technology, a color filter layer 04 comprising filters of at least three colors should also be formed on the thin film encapsulation layer 03. The color filter layer 04 is used for realizing filtering of various colors. However, the OLED panel formed in this way has a relatively thick film layer. The manufacturing process is relatively complex; moreover, the light path is increased, the luminous efficiency is reduced, and the display effect of the OLED panel is influenced.

Therefore, how to simplify the film layer structure of the OLED panel, reduce the manufacturing processes, shorten the light path, and improve the luminous efficiency is a technical problem that needs to be solved by the skilled person in the art urgently.

SUMMARY OF THE INVENTION

In view of this, the embodiments of the present invention provide a top-emitting organic electroluminescent display panel, a manufacturing method thereof, and a display device, which can simplify the film layer structure of the OLED panel, reduce the manfucturing process, shorten the light path from the light emitting layer to the color filter layer, and improve the luminous efficiency.

Therefore, an embodiment of the present invention provides a top-emitting organic electroluminescent display panel, comprising: a substrate, a layer of white organic light emitting diodes and a thin film encapsulation layer arranged on the substrate in sequence. The thin film encapsulation layer comprises at least two inorganic thin film layers and at least one organic thin film layer, wherein one of the at least one organic thin film layer is a color filter layer comprising filters of at least three different colors for full color display, the color filter layer being arranged between the at least two inorganic thin film layers.

In a possible implementation of the above top-emitting organic electroluminescent display panel, the inorganic thin film layer and the organic thin film layer are arranged alternately.

In a possible implementation of the above top-emitting organic electroluminescent display panel, the thickness of the inorganic thin film layer is 30 nm to 2000 nm; the thickness of the color filter layer is 30 nm to 3000 nm.

In a possible implementation of the above top-emitting organic electroluminescent display panel, the material of the color filter layer is resin.

In a possible implementation of the above top-emitting organic electroluminescent display panel, it further comprises: a buffer layer arranged between the color filter layer and the inorganic thin film layer adjacent below.

In a possible implementation of the above top-emitting organic electroluminescent display panel, the thickness of the buffer layer is 5 nm to 1000 nm.

In a possible implementation of the above top-emitting organic electroluminescent display panel, the material of the buffer layer is one of $TiO_2$, SiNx or SiOx or a combination thereof.

In a possible implementation of the above top-emitting organic electroluminescent display panel, a black matrix is arranged between any two adjacent filters in the color filter layer.

In a possible implementation of the above top-emitting organic electroluminescent display panel, the thickness of the black matrix is less than or equal to the thickness of the color filter layer.

In a possible implementation of the above top-emitting organic electroluminescent display panel, the color filter layer further comprises a white light transmission area.

In a possible implementation of the above top-emitting organic electroluminescent display panel, a planarization layer is arranged in the white light transmission area of the color filter layer.

In a possible implementation of the above top-emitting organic electroluminescent display panel, the thickness of the planarization layer is less than or equal to the thickness of the color filter layer.

In a possible implementation of the above top-emitting organic electroluminescent display panel, the material of the inorganic thin film layer in the inorganic thin film layers that is closest to the substrate is one of $Al_2O_3$, $SiN_x$ or $SiO_x$ or a combination thereof.

In a possible implementation of the above top-emitting organic electroluminescent display panel, the material of other inorganic thin film layers in the inorganic thin film layers except for the inorganic thin film layer that is closest to the substrate is one of $Al_2O_3$, $TiO_2$, $SiN_x$ or $SiO_x$ or a combination thereof.

The embodiment of the present invention further provides a method of manufacturing the above top-emitting organic electroluminescent display panel provided by the embodiment of the present invention, comprising:

forming a layer of white organic light emitting diodes on a substrate;

forming at least two inorganic thin film layers and at least one organic thin film layer on the substrate on which the layer of white organic light emitting diodes is formed; wherein one of the at least one organic thin film layer is a color filter layer comprising filters of at least three different colors for full color display, the color filter layer being arranged between the at least two inorganic thin film layers.

In a possible implementation of the provided method, after forming the color filter layer, further comprises: performing postbaking process to the color filter layer.

The disclosure of the present invention further provides a display device comprising the above top-emitting organic electroluminescent display panel provided by the embodiment of the present invention.

The beneficial effects of the embodiment of the present invention include:

The embodiments of the present invention provide a top-emitting organic electroluminescent display panel, a manufacturing method thereof and a display device; the top-emitting organic electroluminescent display panel comprising: a substrate, a layer of white organic light emitting diodes and a thin film encapsulation layer arranged on the substrate in sequence; wherein the thin film encapsulation layer comprises at least two inorganic thin film layers and at least one organic thin film layer; wherein one of the at least one organic thin film layer is a color filter layer comprising filters of at least three different colors for full color display, the color filter layer being arranged between the at least two inorganic thin film layers. Since one of the organic thin film layers in the thin film encapsulation layer is a color filter layer, the color filter layer does not have to be arranged above the thin film encapsulation layer separately; in this way, it can not only reduce the film layer number of the display panel, simplify the film layer structure, reduce the process flows and reduce the manufacturing cost, but also can shorten the light path from the light emitting layer to the color filter layer, thereby improving the luminous efficiency and the display effect.

DETAILED DESCRIPTION OF THE INVENTION

Figure 1:
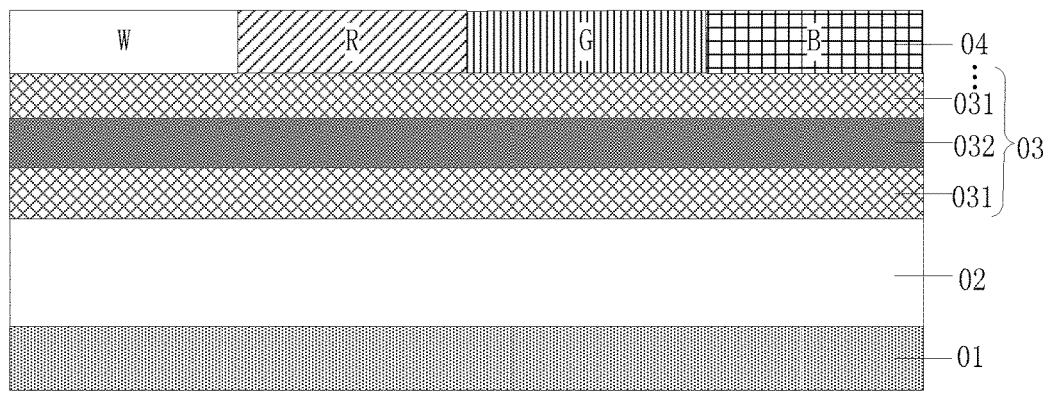
FIG. 1 is a structural schematic diagram of a top-emitting organic electroluminescent display panel in the prior art.

The specific implementations of the top-emitting organic electroluminescent display panel, the manufacturing method thereof, and the display device provided by the embodiment of the present invention will be explained in detail below with reference to the drawings.

The thickness and the shape of the film layers in the drawings may not reflect the real proportion of the top-emitting organic electroluminescent display panel, but are merely for purposes of explanation and clarification of the present invention schematically.

An embodiment of the present invention provides a top-emitting organic electroluminescent display panel, as shown in FIG. 2a to FIG. 2d, comprising: a substrate 100, a layer of white organic light emitting diodes 200, and a thin film encapsulation layer 300 arranged on the substrate 100 in sequence. The thin film encapsulation layer 300 comprises at least two inorganic thin film layers 301 and at least one organic thin film layer 302.

One of the at least one organic thin film layer 302 is a color filter layer 400 comprising filters of at least three different colors for full color display, the color filter layer 400 being arranged between the at least two inorganic thin film layers 301, 301.

In the above top-emitting organic electroluminescent display panel provided by the embodiment of the present invention, since one of the organic thin film layers in the thin film encapsulation layer is a color filter layer comprising filters of at least three different colors for full color display, the color filter layer does not have to be arranged above the thin film encapsulation layer separately. In this way, it can not only reduce the film layer number of the display panel, simplify the film layer structure, reduce the process flows and reduce the manufacturing cost, but also can shorten the light path from the light emitting layer to the color filter layer, thereby improving the luminous efficiency and the display effect.

In a specific implementation, in the above top-emitting organic electroluminescent display panel provided by the embodiment of the present invention, the inorganic thin film layer 301 and the organic thin film layer 302 are arranged alternately, thereby further blocking external moisture and oxygen permeation.

In some implementations, in the above top-emitting organic electroluminescent display panel provided by the embodiment of the present invention, the thickness of the inorganic thin film layer 301 can be set as 30 nm to 2000 nm, and/or the thickness of the color filter layer 400 can be set as 30 nm to 3000 nm. Specifically, the specific thickness of the inorganic thin film layer 301 and the color filter layer 400 can be selected based on specific conditions, which will not be limited here.

In specific implementations, in the above top-emitting organic electroluminescent display panel provided by the embodiment of the present invention, the material of the color filter layer 400 can be resin. The resin material may be an organic material, which can not only have the function of color filtering, but also can effectively prevent the inorganic thin film layer 301 from cracking due to its relatively high elasticity.

Figure 2A:
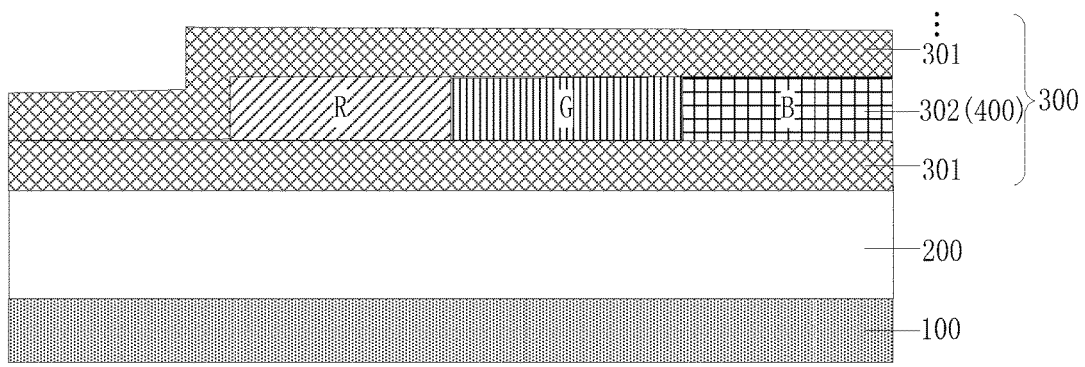
FIG. 2a to FIG. 2d are respectively structural schematic diagrams of a top-emitting organic electroluminescent display panel provided by the embodiment of the present invention.
Figure 2B:
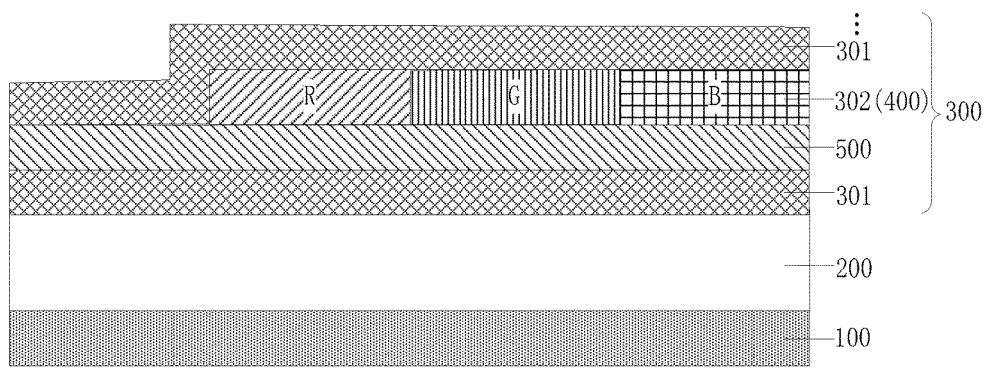

In specific implementations, in the above top-emitting organic electroluminescent display panel provided by the embodiment of the present invention, in order to avoid the inorganic thin film layer formed in the process of manufacturing the color filter layer from being damaged or cracking, as shown in FIG. 2b, the top-emitting organic electroluminescent display panel can comprise: a buffer layer 500 arranged between the color filter layer 400 and the inorganic thin film layer 301 adjacent below. Thus it can have the function of buffering in the process of forming the color filter layer 400, and ensure that the inorganic thin film layer 301 adjacent below will not be damaged.

In a specific implementation, in the above top-emitting organic electroluminescent display panel provided by the embodiment of the present invention, the thickness of the buffer layer 500 can be set as 5 nm to 1000 nm. Specifically, the specific thickness of the buffer layer 500 can be selected based on specific conditions, which will not be limited here.

In a specific implementation, in the above top-emitting organic electroluminescent display panel provided by the embodiment of the present invention, the material of the buffer layer 500 can be one of $TiO_2$, SiNx or SiOx or a combination thereof. Specifically, selecting the material of the above buffer layer 500 reasonably can further realize the buffering function, the specific material of the buffer layer 500 can be selected based on specific conditions, which will not be limited here.

Figure 2C:
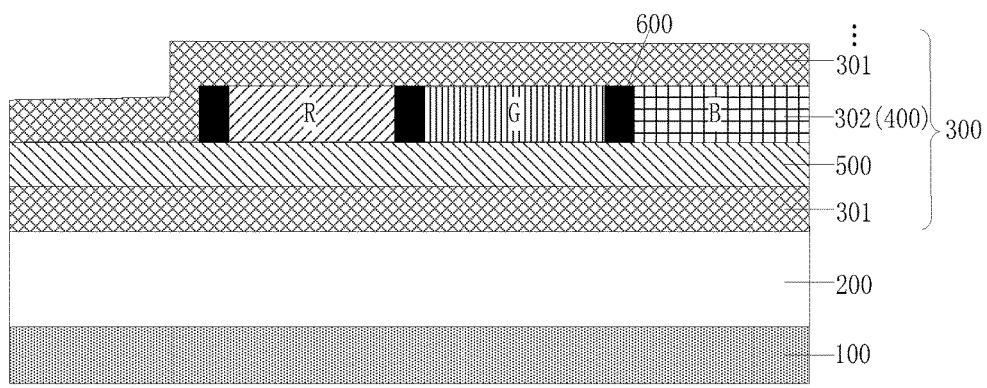

In specific implementations, in the above top-emitting organic electroluminescent display panel provided by the embodiment of the present invention, in order to avoid color mixing phenomenon, as shown in FIG. 2c, a black matrix 600 can be arranged between any two adjacent filters in the color filter layer 400. The black matrix 600 can block the light which is in the light beam emitted from the light emitting area of the white organic light emitting diodes corresponding to the filters and towards the edges of the filter, so as to prevent occurrence of the color mixing phenomenon.

In a specific implementation, in the above top-emitting organic electroluminescent display panel provided by the embodiment of the present invention, the thickness of the black matrix 600 can be less than or equal to the thickness of the color filter layer 400. Specifically, the specific thickness of the black matrix 600 can be selected based on specific conditions, which will not be limited here.

Figure 2D:
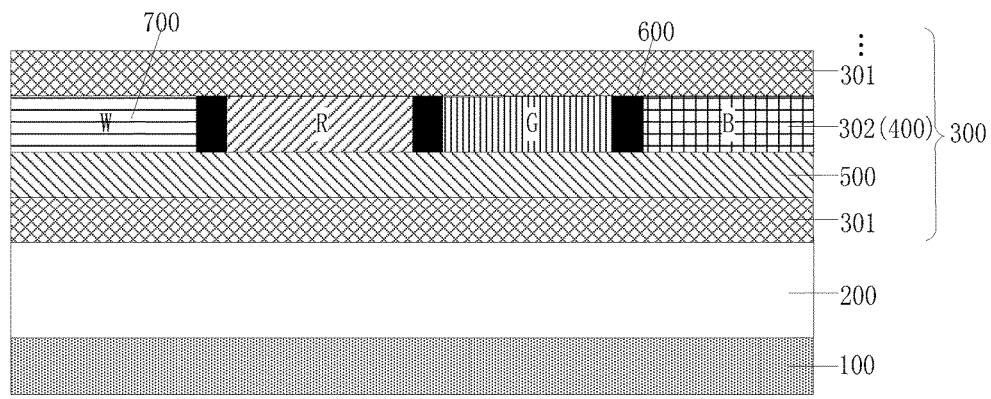

In a specific implementation, in the above top-emitting organic electroluminescent display panel provided by the embodiment of the present invention, in order to realize RGBW color imaging, as shown in FIG. 2d, the color filter layer 400 may further comprises a white light transmission area W, thus the color saturation can be improved.

In a specific implementation, in the above top-emitting organic electroluminescent display panel provided by the embodiment of the present invention, in order to further enable the inorganic thin film layer 301 on the color filter layer 400 to be connected with the color filter layer 400 better, as shown in FIG. 2d, a planarization layer 700 can be arranged in the white light transmission area W of the color filter layer 400. In order to improve the luminous efficiency of the WOLED, as shown in FIG. 2a to FIG. 2c, the planarization layer 700 may also not be arranged. The planarization layer can be selected based on specific conditions, which will not be limited here.

In a specific implementation, in the above top-emitting organic electroluminescent display panel provided by the embodiment of the present invention, the thickness of the planarization layer 700 can be less than or equal to the thickness of the color filter layer 400. Specifically, the specific thickness of the planarization layer 700 can be selected based on specific conditions, which will not be limited here.

In a specific implementation, in the above top-emitting organic electroluminescent display panel provided by the embodiment of the present invention, the material of the inorganic thin film layer in the inorganic thin film layers 301 that is closest to the substrate is one of $Al_2O_3$, $SiN_x$ or $SiO_x$ or a combination thereof; the material of other inorganic thin film layers except for the inorganic thin film layer that is closest to the substrate is one of $Al_2O_3$, $TiO_2$, $SiN_x$ or $SiO_x$ or a combination thereof. Specifically, selecting the materials of the above inorganic thin film layers 301 reasonably can be further used for blocking external moisture and oxygen permeation. The specific materials of the inorganic thin film layers 301 can be selected based on specific conditions, which will not be limited here.

In a specific implementation, the top-emitting organic electroluminescent display panel provided by the embodiment of the present invention may generally also have other structures such as anode, adhesive, protective layer; these specific structures may have various implementations, which will not be limited here.

Based on the same inventive concept, the embodiment of the present invention further provides a method of manufacturing the above top-emitting organic electroluminescent display panel provided by the embodiment of the present invention, since the principle of the method for solving problems is similar with the preceding top-emitting organic electroluminescent display panel, the implementation of the method can make reference to the implementation of the top-emitting organic electroluminescent display panel, which will not be repeated here.

Figure 3:
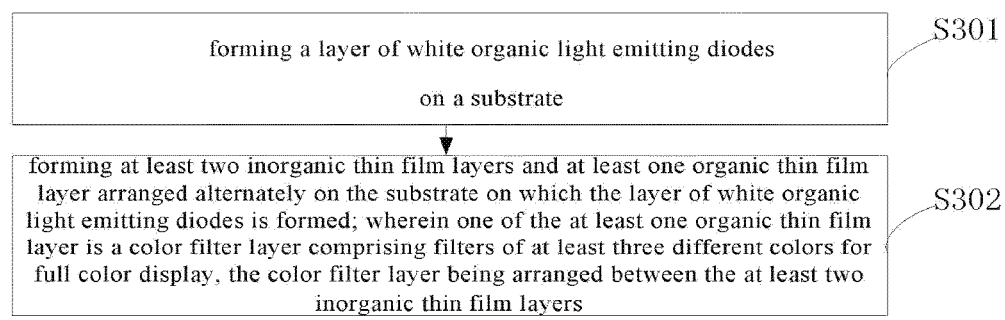
FIG. 3 is a flow chart of a method of manufacturing a top-emitting organic electroluminescent display panel provided by the embodiment of the present invention.

In a specific implementation, the method of manufacturing a top-emitting organic electroluminescent display panel provided by the embodiment of the present invention, as shown in FIG. 3, specifically comprises the steps of:

S301, forming a layer of white organic light emitting diodes on a substrate;

S302, forming at least two inorganic thin film layers and at least one organic thin film layer on the substrate on which the layer of white organic light emitting diodes is formed; wherein one of the at least one organic thin film layer is a color filter layer comprising filters of at least three different colors for full color display, the color filter layer being arranged between the at least two inorganic thin film layers.

In a specific implementation, in the method of manufacturing the above top-emitting organic electroluminescent display panel provided by the embodiment of the present invention, in order to further remove moisture, and enhance the adhesion between the color filter layer and the inorganic thin film layer, after forming the color filter layer in step 302, it may further comprise: performing a postbaking process to the color filter layer. It needs to be noted that the postbaking process can be performed immediately after the color filter layer is formed, and can also be performed after the whole encapsulation thin film layer is formed. Since the condition of the postbaking process (≤100□) is same as that of the thermal aging process, an additional thermal aging process after the OLED manufacture can be omitted, it only needs to perform the above mentioned postbaking process, so as to simplify the manfuacturing process.

Figure 4A:
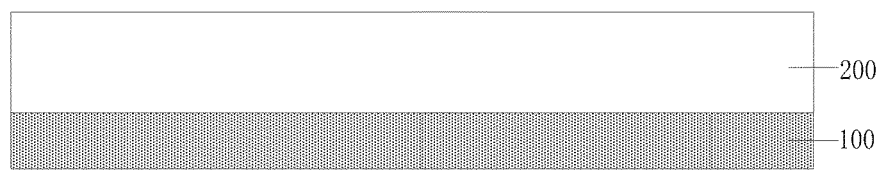
FIG. 4a to FIG. 4f are respectively structural schematic diagrams after performing respective steps of the method for manufacturing a top-emitting organic electroluminescent display panel provided by the embodiment of the present invention.

The method of manufacturing a top-emitting organic electroluminescent display panel provided by the embodiment of the present invention as shown in FIG. 2d will be explained in detail below with a specific example, specifically comprising the steps of:

1. forming a layer of white organic light emitting diodes on a substrate. In a specific implementation, as shown in FIG. 4a, a layer of white organic light emitting diodes 200 (WOLED) is formed on the substrate 100.

Figure 4B:
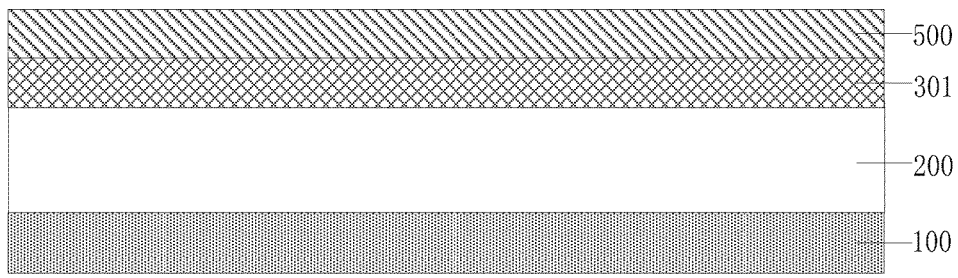
Figure 4C:
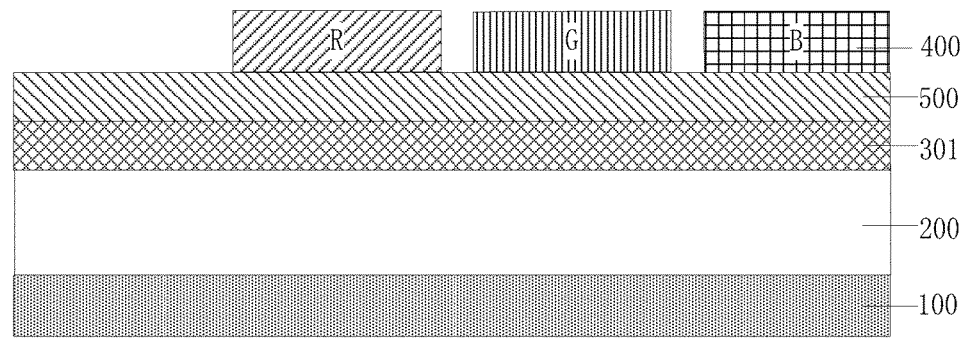
Figure 4D:
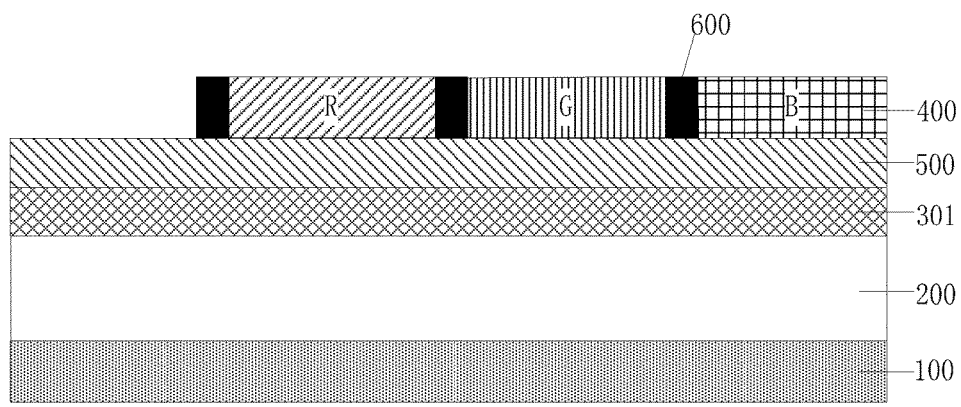
Figure 4E:
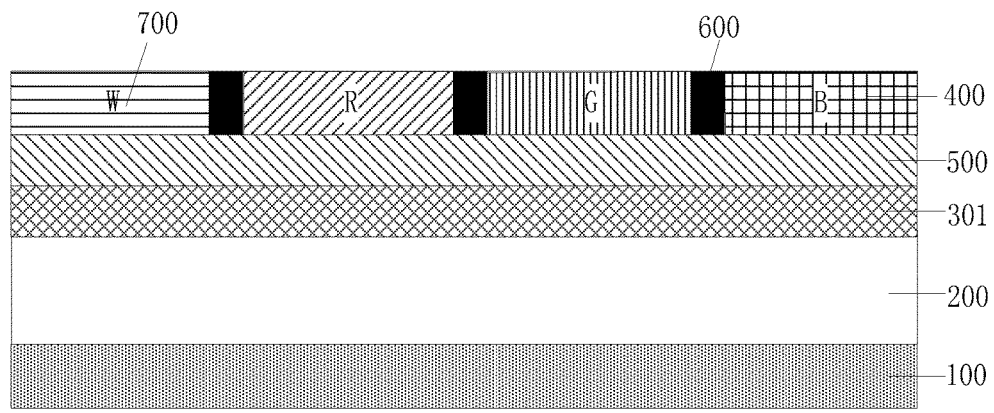

2. forming an inorganic thin film layer and a buffer layer in sequence on the substrate on which a layer of white organic light emitting diodes is formed. In a specific implementation, as shown in FIG. 4b, an $Al_2O_3$ single layer thin film is formed firstly with atomic layer deposition (ALD) as the inorganic thin film layer 301, and then a $TiO_2$ single layer thin film is formed as the buffer layer 500, the water vapor transmission rate (WVTR) level of the inorganic thin film layer can reach a level below $10^{-6}$;

3. forming a pattern of the color filter layer on the buffer layer. In a specific implementation, as shown in FIG. 4c, a color filter layer 400 comprising filters of three colors of red (R), green (G), and blue (B) is formed with the filter manufacturing process;

4. forming a black matrix between any two adjacent filters in the color filter layer. In a specific implementation, as shown in FIG. 4d, a black matrix 600 is formed between the red filter R and the green filter G as well as between the green filter G and the blue filter B; here, the thickness of the black matrix 600 is equal to the thickness of the color filter layer 400;

5. forming a planarization layer in a white light transmission area of the color filter layer. In a specific implementation, as shown in FIG. 4e, a planarization layer 700 is formed in the white light transmission area of the color filter layer 400; here, the thickness of the planarization layer 700 is equal to the thickness of the color filter layer 400;

6. performing postbaking process to the color filter layer. In a specific implementation, when postbaking process is performed to the color filter layer 400, the temepature does not exeed 100° C., so as to avoid damage to the WOLED.

Figure 4F:
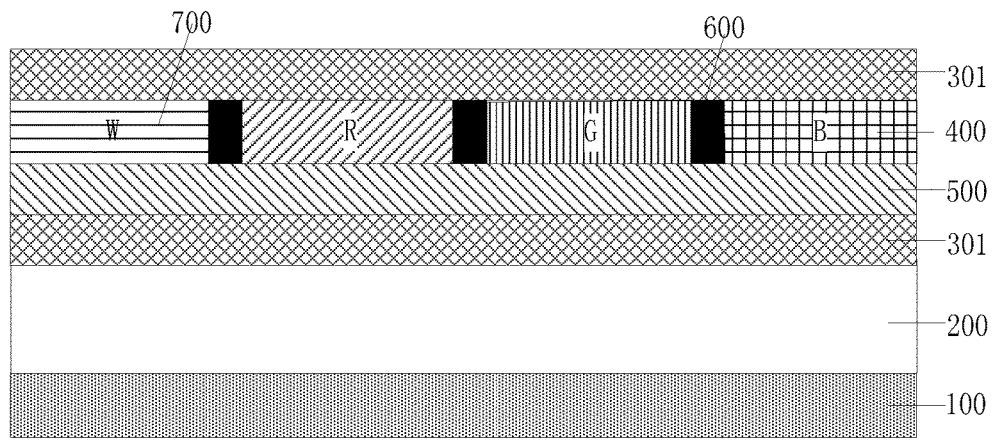

7. forming an inorganic thin film layer on the color filter layer. In specific implementations, as shown in FIG. 4f, an organic thin film layer 301 is formed on the color filter layer 400.

Thus, the above top-emitting organic electroluminescent display panel provided by the embodiment of the present invention is manufactured with the above steps 1 to 7 provided by the specific example.

Based on the same inventive concept, the embodiment of the present invention further provides a display device comprising the above top-emitting organic electroluminescent display panel provided by the embodiment of the present invention, the display device may be any product or component with the display function such as: a mobile phone, a tablet computer, a television, a display, a laptop, a digital photo frame, a navigator, etc. Other essential components of the display device should all be possessed as understood by the ordinary skilled person in the art, which will not be repeated here, and should not be taken as limitations to the present invention either. The implementation of the display device can make reference to the embodiments of the above top-emitting organic electroluminescent display panel, which will not be repeated here.

The embodiment of the present invention provides a top-emitting organic electroluminescent display panel, a manufacturing method thereof and a display device; the top-emitting organic electroluminescent display panel comprising: a substrate, a layer of white organic light emitting diodes and a thin film encapsulation layer arranged on the substrate in sequence; wherein the thin film encapsulation layer comprises at least two inorganic thin film layers and at least one organic thin film layer; wherein one of the at least one organic thin film layer is a color filter layer comprising filters of at least three different colors for full color display, the color filter layer being arranged between the at least two inorganic thin film layers. Since one of the organic thin film layers in the thin film encapsulation layer is a color filter layer, the color filter layer does not have to be arranged above the thin film encapsulation layer separately; in this way, it can not only reduce the film layer number of the display panel, simplify the film layer structure, and reduce the process flows and reduce the manufacturing cost, but also can shorten the light path from the light emitting layer to the color filter layer, thereby improving the luminous efficiency and the display effect.

A person having ordinary skill in the art may make various modifications and variations to the present invention without departing from the spirit and scope of the present invention. In this way, provided that these modifications and variations of the present invention belong within the scope of the claims of the present invention and the equivalent technologies thereof, the present invention also intends to cover these modifications and variations.

The Invention Claimed is:

1. A method of manufacturing a top-emitting organic electroluminescent display panel, comprising:
   forming a layer of white organic light emitting diodes on a substrate;
   forming at least two inorganic thin film layers and at least one organic thin film layer on the substrate on the substrate on which the layer of white organic light emitting diodes is formed, wherein one of the at least one organic thin film layer is a color filter layer comprising filters of at least three different colors for full color display, the color filter layer being arranged between the at least two inorganic thin film layers;
   forming a buffer layer between the color filter layer and the inorganic thin film layer adjacent below; the material of the buffer layer being one of $TiO_2$, SiNx or SiOx or a combination thereof;
   forming a black matrix between any two adjacent filters in the color filter layer; and
   performing a postbaking process to the color filter layer, thereby removing moisture and realizing thermal aging to the white organic light emitting diodes.

2. The method as claimed in claim 1, wherein a temperature of postbaking process is lower than 100° C.

3. The method as claimed in claim 1, wherein the inorganic thin film layer and the organic thin film layer are arranged alternately.

4. The method as claimed in claim 1, wherein a thickness of the inorganic thin film layer is 30 nm to 2000 nm, the thickness of the color filter layer is 30 nm to 3000 nm.

5. The method as claimed in claim 1, wherein a material of the color filter layer is resin.

6. The method as claimed in claim 1, further comprising: forming a buffer layer between the color filter layer and the inorganic thin film layer adjacent below.

7. The method as claimed in claim 6, wherein a thickness of the buffer layer is 5 nm to 1000 nm.

8. The method as claimed in claim 6, wherein a material of the buffer layer is one of TiO2, SiNx or SiOx or a combination thereof.

9. The method as claimed in claim 1, wherein a thickness of the black matrix is less than or equal to a thickness of the color filter layer.

\* \* \* \* \*